United States Patent [19]

Shimizu

[11] Patent Number: 5,148,964
[45] Date of Patent: Sep. 22, 1992

[54] WIRE BONDING METHOD

[75] Inventor: Yasuhiko Shimizu, Yokohama, Japan

[73] Assignee: Kabushiki Kaisha Toshiba, Kawasaki, Japan

[21] Appl. No.: 645,650

[22] Filed: Jan. 25, 1991

[30] Foreign Application Priority Data

Feb. 13, 1990 [JP] Japan .................................. 2-29534

[51] Int. Cl.⁵ ........................ B23K 1/06; B23K 37/00; B23K 31/12
[52] U.S. Cl. .................................... 228/102; 228/1.1; 228/110
[58] Field of Search ................... 228/102, 1.1, 110

[56] References Cited

U.S. PATENT DOCUMENTS

| | | | |
|---|---|---|---|
| 4,327,860 | 5/1982 | Kirshenboin et al. | 228/4.5 |
| 4,445,633 | 5/1984 | Bonham, Jr. | 228/102 |
| 4,610,387 | 9/1986 | Scavino | 228/1.1 |
| 4,932,584 | 6/1990 | Yamazaki et al. | 228/179 |
| 4,958,762 | 9/1990 | Shimizu et al. | 228/1.1 |

FOREIGN PATENT DOCUMENTS

| | | | |
|---|---|---|---|
| 63-42135 | 2/1988 | Japan | 228/4.5 |
| 63-58849 | 3/1988 | Japan | 228/110 |
| 63-232344 | 9/1988 | Japan | 228/102 |

*Primary Examiner*—Kurt Rowan
*Assistant Examiner*—Jeffrey T. Knapp
*Attorney, Agent, or Firm*—Foley & Lardner

[57] ABSTRACT

A wire bonding method for connecting an electrode pad on a semiconductor chip and an inner lead of a lead frame through a metal wire is described. The wire bonding method is performed by moving a bonding tool holding the wire metal. The method comprises the steps of calculating the height difference between the electrode pad and the inner lead, determining a reverse movement amount of the bonding tool according to the height difference, and reversing the bonding tool horizontally at a predetermined level by the determined reverse movement amount while raising vertically the bonding tool. According to the present invention, the amount of reverse movement of the bonding tool may be automatically changed in accordance with the height difference and without reliance on an operator.

9 Claims, 5 Drawing Sheets

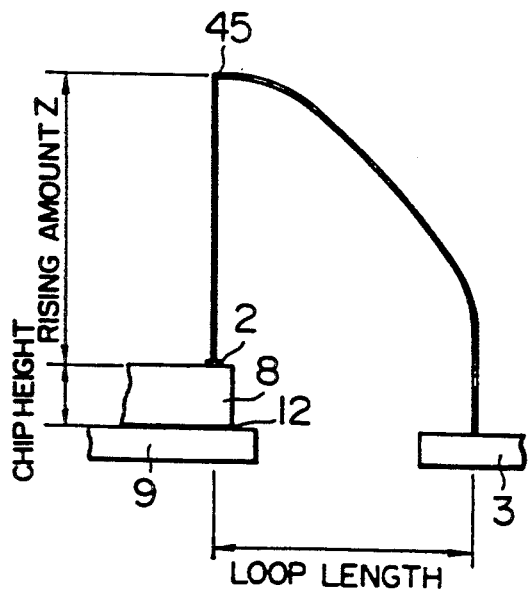
FIG. 6A
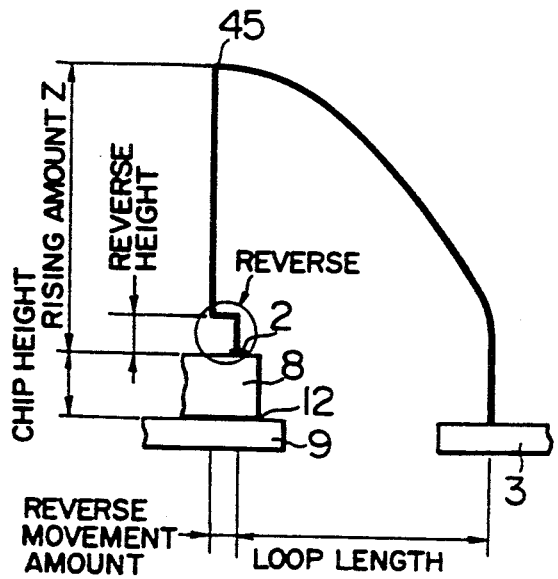
FIG. 6B
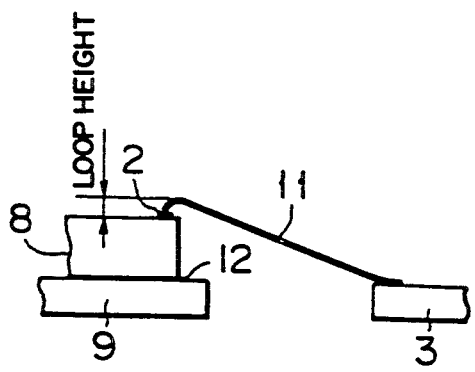
FIG. 6A₁
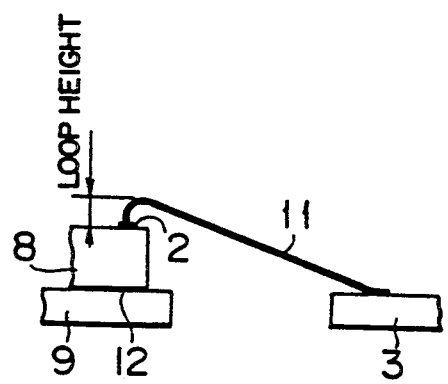
FIG. 6B₁
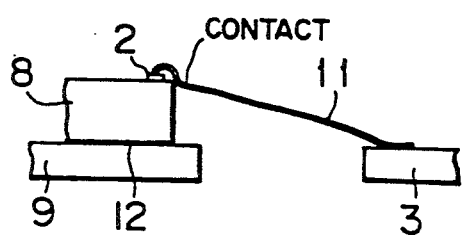
FIG. 6A₂

WIRE BONDING METHOD

BACKGROUND OF THE INVENTION

The present invention relates to a wire bonding method used for producing a semiconductor device.

The wire bonding method has been used for connecting an electrode pad on a semiconductor chip and an inner lead of a lead frame through metal wires having a diameter of 20-30 μm, such as gold wire or aluminum wire.

Heat pressure welding, ultrasonic bonding, and the combination of heat pressure welding and ultrasonic bonding have been adopted in the wire bonding method.

Heat pressure welding is the method where the clean surfaces of both metal materials are pressed below the melting points of the two metal materials, so that the bonding of both the metal materials is performed not by the melting of the metal materials but by the diffusion of the metal materials.

Ultrasonic bonding is the method where ultrasonic oscillation is transmitted to the metal wire, and the metal wire is pressed against the electrode pad made of aluminum, for example, and after that, the bonding is performed by the friction heat occurring between the electrode pad and the metal wire.

The inner lead and the electrode pad are connected by a metal wire forming a loop. When the height of the loop is low, the metal wire comes into contact with the semiconductor chip, and therefore problems of short circuiting may occur.

In order to prevent problems of short-circuiting, a capillary holding the metal wire is operated in a manner such that the capillary is horizontally moved (reversed) at a predetermined level while raising the capillary.

In the conventional wire bonding method, operators change the amount of reverse of the capillary every time the shape of the loop varies according to the height difference between the electrode pad and the inner lead.

However, it is difficult to precisely and quickly change the reverse movement amount of the capillary because the operator changes it by watching the shape of the loop. This has been a problem in a quality control.

SUMMARY OF THE INVENTION

It is an object of the present invention to provide a wire bonding method where the amount of reverse movement of a capillary may be automatically changed according to the height difference between the electrode pad and the inner lead without relying on operators, so that the quality of a semiconductor device is improved.

The foregoing object is accomplished by providing a wire bonding method for connecting an electrode pad on a semiconductor chip and an inner lead of a lead frame through metal wire by moving a bonding tool holding the metal wire, comprising the steps of: calculating the height difference between the electrode pad and the inner lead, determining a reverse movement amount of the bonding tool according to the height difference, bonding the metal wire held by the bonding tool to the electrode pad, raising the bonding tool vertically to a predetermined level, horizontally reversing the bonding tool at the predetermined level by the determined reverse movement amount, vertically raising the bonding tool further to a top level, moving the bonding tool towards the inner lead and bonding the metal wire to the inner lead.

In the present invention, the reverse movement amount of the bonding tool may be automatically changed according to the height difference between the electrode pad and the inner lead without relying on operators, so that the quality of the semiconductor device is improved.

BRIEF DESCRIPTION OF THE DRAWINGS

FIG. 6 is a side view showing tracks of a capillary and the loop shapes, wherein (FIG. 6A) shows the track without reverse movement, FIG. 6A1 shows the loop shape without the reverse movement, FIG. 6A2 shows the loop shape without the reverse movement which causes a short-circuit problem, FIG. 6B shows the track with the reverse movement, and FIG. 6B1 shows the loop shape with the reverse movement.

DESCRIPTION OF THE PREFERRED EMBODIMENTS

For a better understanding the background of the present invention, the basic principle of the conventional wire bonding method is first described hereinafter with reference to FIGS. 1 to 3.

Figure 1:
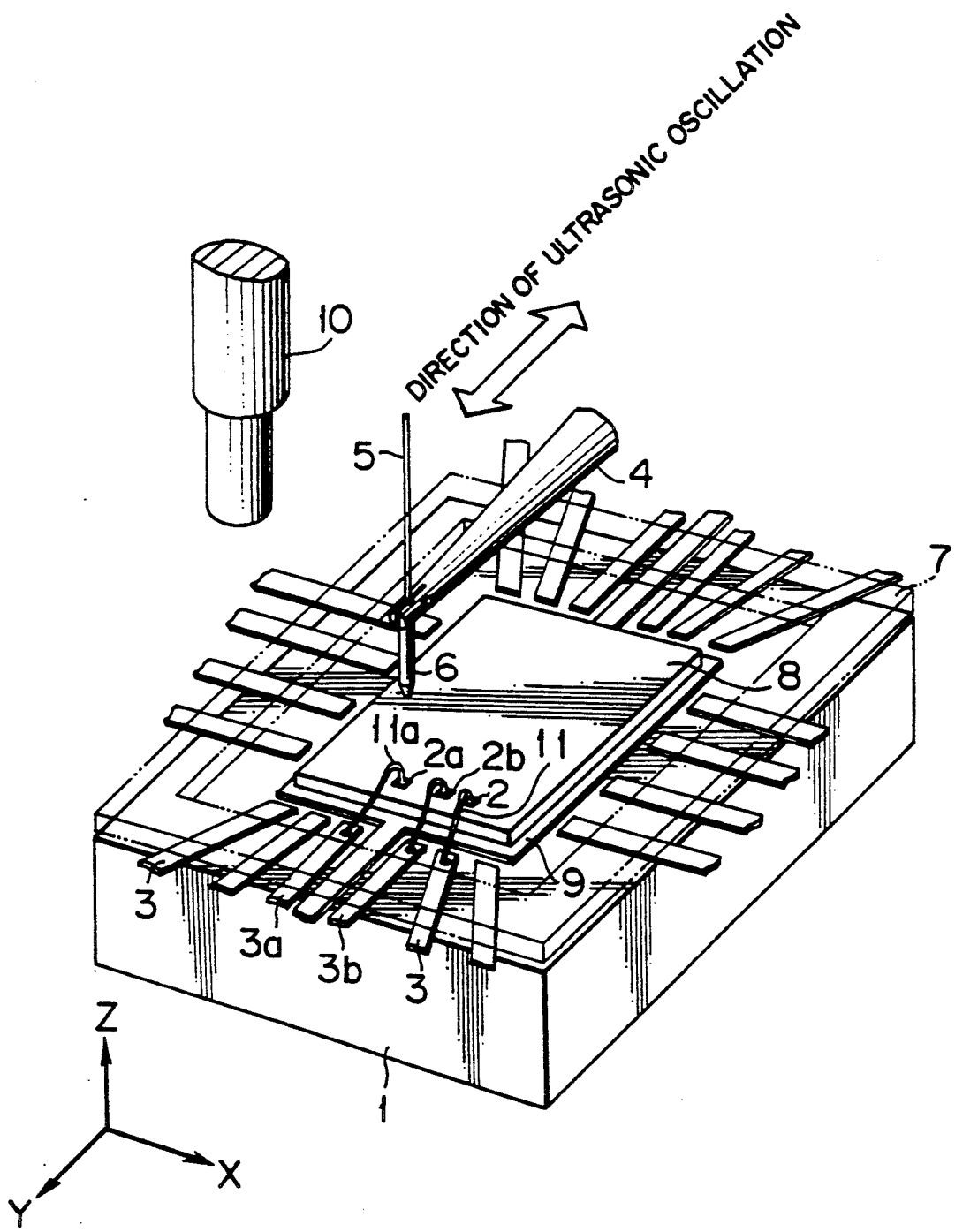
FIG. 1 is a perspective view showing a wire bonding method according to the present invention.
Figure 2:
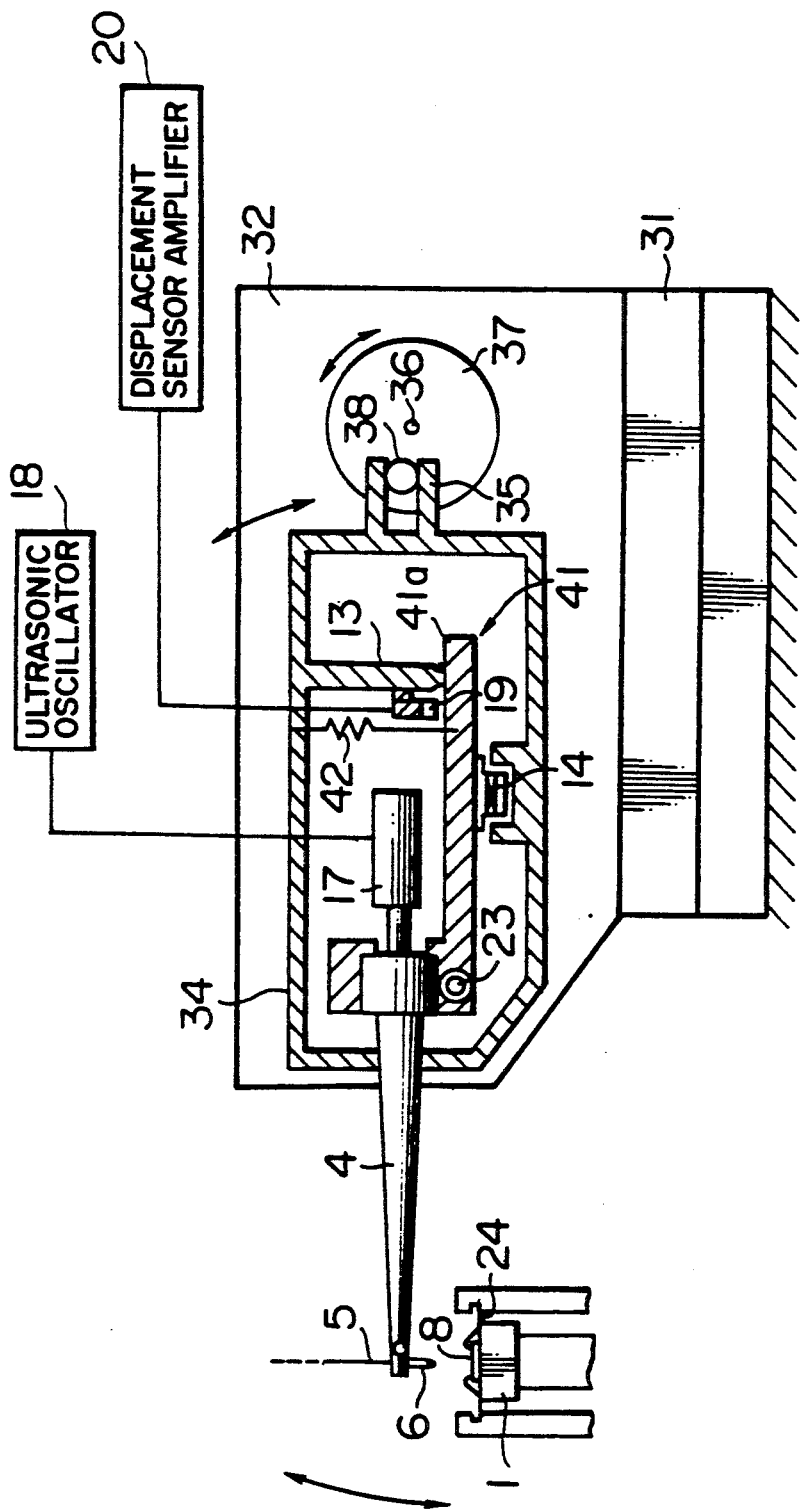
FIG. 2 is a schematic view of a wire bonding apparatus used for performing the wire bonding method.

FIG. 1 is a perspective view showing the conventional wire bonding method, and FIG. 2 is a schematic view of the conventional wire bonding apparatus used for performing the wire bonding method.

In FIGS. 1 and 2, a bonding head 32 has a capillary 6. The lower end of the capillary 6 is moved between the electrode pads 2a, 2b on the semiconductor chip 8 and the inner leads 3a, 3b on the lead frame 24 by driving an X-Y table 31.

The motion of the capillary 6 in Z direction is as follows. A disk 37 is rotated about a shaft 36 by a motor (not shown) fixed to the disk 37, so that a body 34 is rotated about a shaft 23 through a pin 38. A support member 41 having an ultrasonic horn 4 is pressed against a stopper 13 of the body 34 by a spring 42 and a linear motor 14, so that the body 34 and the support member 41 are moved as one body. Namely, the support member 41 having the ultrasonic horn 4 and the body 34 are rotated about the shaft 23, and the capillary 6 held by the ultrasonic horn 4 is moved in the Z direction by driving the motor of the disk 37.

The operation of the wire bonding apparatus is as follows.

First, gold wire 5a–d is inserted within the capillary 6 secured to the end of the ultrasonic horn 4. Then the lower end of the gold wire 5 is formed to a spherical shape by heating operation of a torch mechanism (not shown). The torch mechanism generates an electric spark of high voltage electric current between a torch (not shown) and the gold wire 5, so that the end of the gold wire 5 is melted and formed to a spherical shape by the energy of the electric spark.

Figure 3:
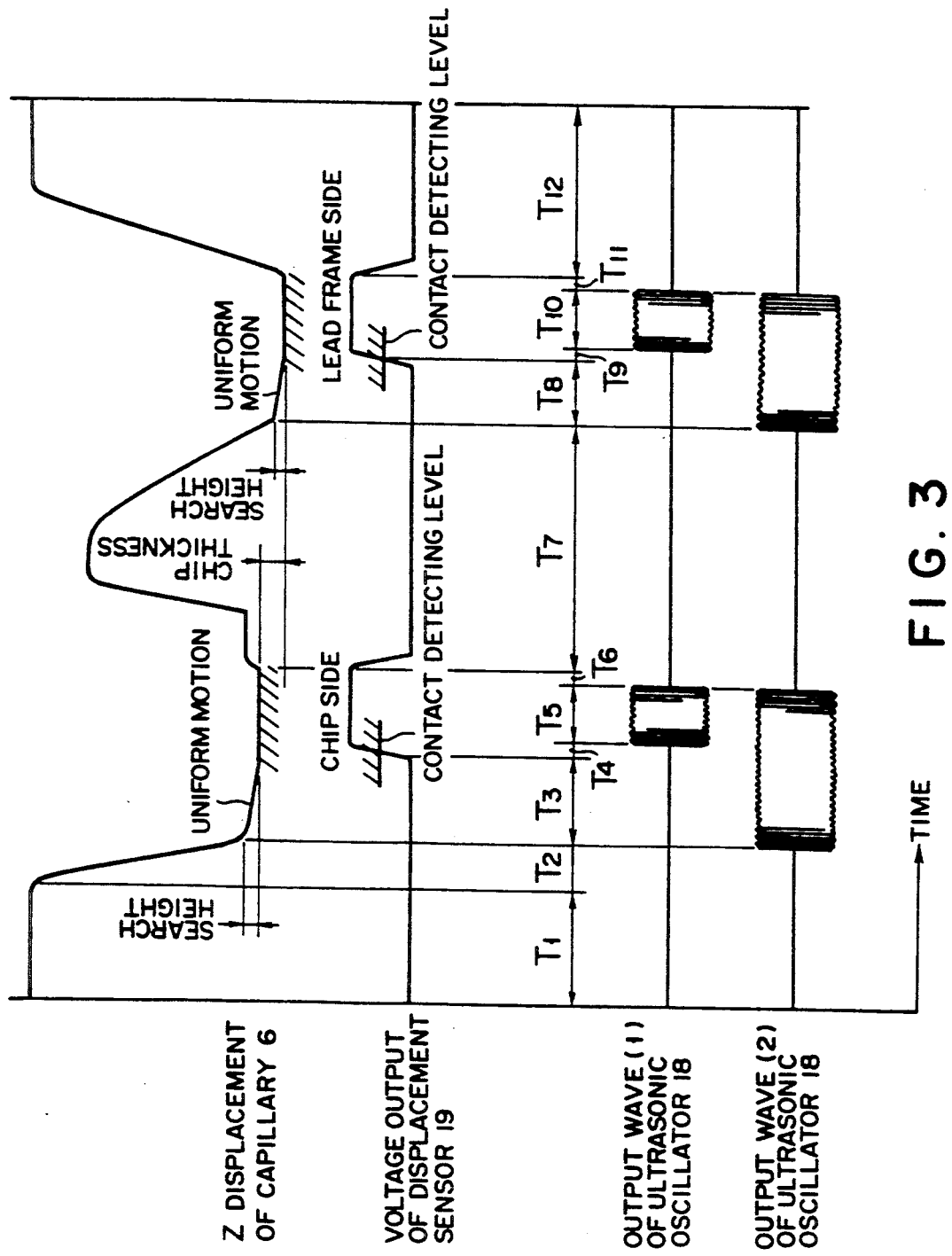
FIG. 3 is a sequence diagram of the wire bonding method.

After forming the spherical shape of the gold wire 5, the wire bonding of the gold wire 5 is performed according to the sequence diagram shown in FIG. 3.

The capillary 6 is moved to the electrode pads 2a, on the semiconductor chip 8 by driving the X-Y table 31, and then the capillary 6 is moved according to the Z displacement sequence of FIG. 3. In this way, the loops 11, 11a of the gold wire 5 are formed by moving the capillary 6 between the electrode pads 2a, of the semiconductor chip 8 and the inner leads 3, 3a, 3b on the lead frame 24 (FIG. 1).

The following is a description of the wire bonding of the gold wire 5.

The wire bonding of the gold wire 5 is performed by using both ultrasonic oscillation and heat pressure welding.

As shown in FIG. 3, at first the capillary 6 is rapidly lowered toward the semiconductor chip 8. Then the capillary 6 is decelerated at a search point which has a predetermined search height from the semiconductor chip 8, and after that, the capillary 6 is lowered with uniform motion. This uniform motion may secure the same impact and the proper wire bonding even if the height of the semiconductor chip 8 varies a little. The gold wire 5 impacting against the electrode pads 2 is crushed by the load of the spring 42 and the linear motor 14 and the impact between the gold wire 5 and the electrode pads 2. After that, an alloy layer is formed on the contact surface between the gold wire 5 and the electrode pads 2 by the heat of a heater (not shown) fixed to a sample stand 1, the pressure of the capillary 6, and the ultrasonic oscillation. The wire bonding is therefore completed.

In FIG. 2, the ultrasonic oscillation is generated by a vibrator 17 which is vibrated by an ultrasonic oscillator 18. The ultrasonic oscillation is amplified by the ultrasonic horn 4 and transmitted to the capillary 6. The gold wire 5 is vibrated by the ultrasonic oscillation.

The wire bonding between the gold wire 5 and the inner leads 3 is performed in the same way as that between the gold wire 5 and the electrode pads 2.

In this way, the inner leads 3 and the electrode pads 2 are connected by the gold wire 5, while the lower end of the capillary 6 draws the track as shown in FIGS. 6A and 6B. The gold wire 5 connecting them therefore forms the loops 11.

The shape of the loops 11 is automatically maintained in a same shape as shown in FIG. 6A and 6A1, however when the height of the loops 11 is low, the gold wire 5 comes in contact with the semiconductor chip 8. Therefore, as has been established a problem of short-circuiting may occur (FIG. 6A2.

In order to prevent the short-circuit problem, the capillary 6 is operated in a manner where the lower end of the capillary 6 is horizontally moved (reversed) at a predetermined level while it is raising vertically the capillary 6 to a top level 45 (FIG. 6B). As a result, the height of the loops 11 becomes high, and therefore the loop 11 does not come into contact with the semiconductor chip 8 (FIG. 6B1).

In the past, operators have input to the X-Y table 31 suitable data which makes the suitable shape of the loop 11, while watching the shape of the loop 11 by a detecting camera 10 (FIG. 1).

Figures 5A, 5B:
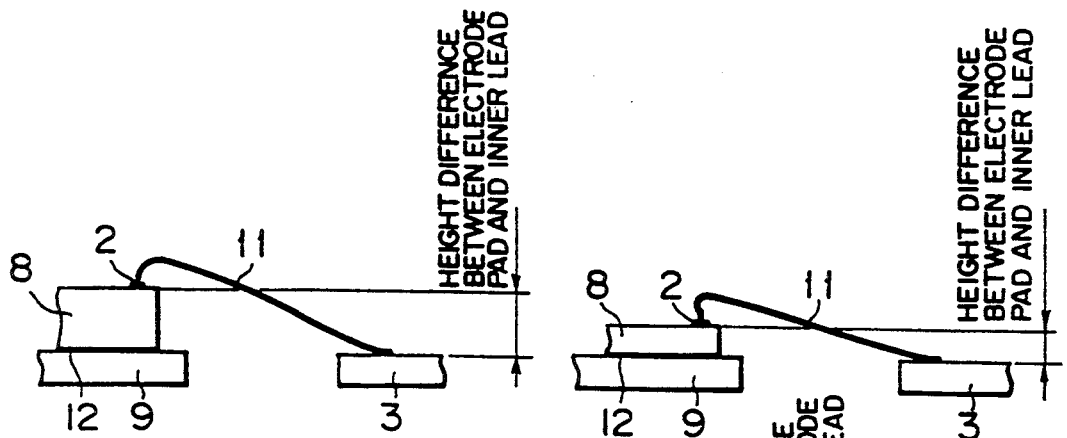
FIG. 5 a–d is a side view showing loop shapes according to the height difference of the electrode pad and the inner lead.
Figure 5C:
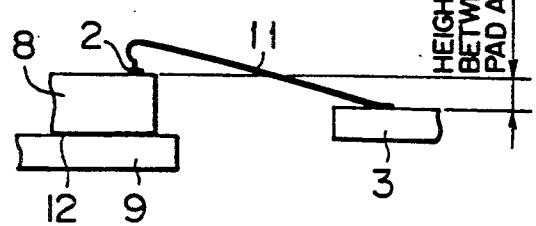
Figure 5D:
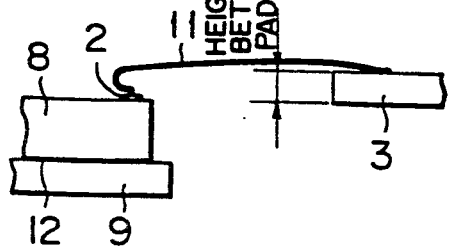

FIG. 5 shows a relationship between the heights of the electrode pads 2 and the inner leads 3. FIG. 5 shows different semiconductor devices, for example the semiconductor device which is provided with the semiconductor chip having a small thickness and the semiconductor device which is provided with the semiconductor chip whose surface is low.

When the wire bonding is performed to different semiconductor chips by wire having the same loop length, and the reverse distance (amount) of the capillary 6 is constant, the shape of the loops 11 varies according to the height difference between the electrode pads 2 and the inner leads 3.

Therefore, the operators have changed the reverse amount of the capillary 6 by watching the shape of the loops 11.

Generally, the reverse amount is usually kept to the first input value.

First Embodiment

A first embodiment of a wire bonding method of the present invention will become understood from the following detailed description referring to the accompanying drawings.

Figure 4:
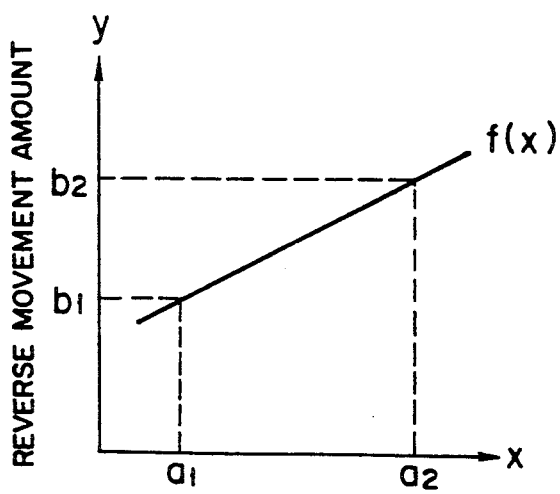
FIG. 4 is a graph showing a relationship between a reverse movement amount and the height difference of an electrode pad and an inner lead.

FIG. 4 shows a function of a relationship between the height difference of the electrode pads 2 and the inner leads 3 and the reverse movement amount of the capillary 6. Namely, when the reverse movement amount is taken along the vertical axis (x axis) and the height difference between the electrode pads 2 and the inner leads 3 is taken along the horizontal axis (y axis), the function of the relationship between them is as follows.

$$y = f(x).$$

This function is predetermined by some experimental data. For example, when the reverse movement suitable for making a good loop shape is $b_1$ while the height difference between the electrode pads 2 and the inner leads 3 is $a_1$, and when the reverse movement is $b_2$ while the height difference is $a_2$, the function is determined as follows by using an interpolation law based on these values.

$$f(x) = \frac{b_2 - b_1}{a_2 - a_1} x + \frac{a_2 b_1 - a_1 b_2}{a_2 - a_1} \tag{1}$$

In this case, the interpolation may be more precisely performed by increasing the number of experimental points to more than two points.

The height difference between the electrode pads 2 and the inner leads 3 is measured by lowering the ultrasonic horn 4 until the gold wire 5 comes in contact with the electrode pads 2 and the inner leads 3, and by detecting the positions of the surfaces of the electrode pads 2 and the inner leads 3.

Detecting the contact between the gold wire 5 and the electrode pads 2 is as follows.

In FIG. 2, the ultrasonic horn 4 is stopped when the capillary 6 is lowered and the gold wire 5 comes into contact with the electrode pads 2. On the other hand, a gap is formed between the support member 41 of the ultrasonic horn 4 and the stopper 13 of the body 34 because the body 34 is continuously rotated by the motor of the disk 37. The voltage output corresponding to the gap is obtained by detecting the gap through the displacement sensor 19 as shown in FIG. 3. The contact between the gold wire 5 and the electrode pads 2 is detected at the point where the voltage output exceeds the predetermined level. At the same time, the positions of the surfaces of the electrode pads 2 are measured by detecting the rotary angle of the motor at the contact point.

The positions of the surfaces of the inner leads 3 are measured in the same way as that of the electrode pads 2.

The ultrasonic oscillation is transmitted to the gold wire 5 from the ultrasonic oscillator 18 during the time $T_5$ after the delay time $T_4$, after detecting the contact as mentioned above.

For the semiconductor device having a various height difference between the electrode pads 2 and the inner leads 3 (FIG. 5a–d), the wire bonding method is performed as follows.

First, the surface heights of both the electrode pads 2 and the inner leads 3 are determined by the surface detecting function of the ultrasonic horn 4 as mentioned above. The height difference between the electrode pads 2 and the inner leads 3 is calculated according to both the surface heights and then the reverse movement amount is automatically determined by substituting the value of the height difference for the equation (1).

When the wire bonding method is performed, the capillary 6 is reversed to form an initially horizontal section of wire according to the reverse movement amount determined by the equation (1).

In this embodiment, the capillary 6 is used as a bonding tool. The wire bonding of the gold wire 5 is performed by ultrasonic heat pressure welding method using both heat pressure welding and ultrasonic bonding.

In this case, it is not necessary to heat the semiconductor chip 8 and the lead frame 24 to about 300° C., so that intermetallic compounds are not formed between the electrode pads 2 made of, for example, aluminum and the gold wire 5. Therefore, the bonding portions between the electrode pads 2 and the gold wire 5 are not weakened. A gold wire having a diameter of 20–30 μm is used in this embodiment.

Second Embodiment

In the first embodiment, for each semiconductor device, the surface heights of both the electrode pads 2 and the inner leads 3 are first detected, then the height difference between the electrode pads 2 and the inner leads 3 is calculated according to the surface heights. Next, the reverse movement amount to initially form a horizontal section of wire is automatically determined by the equation (1), then wire bonding is performed by the determined reverse movement amount between all the electrode pads 2 and all the inner leads 3 of the semiconductor device. Namely, one reverse movement amount is used for one semiconductor device.

However, as shown in FIG. 5a–d, the surface height of the electrode pads 2 includes the thicknesses of a mount resin 12 on an island 9, the semiconductor chip 8, and the electrode pads 2. The island 9 is arranged on a sample stand 1 in FIG. 1. The thickness of the mount resin 12 varies for each semiconductor device. Furthermore, it happens that the mount resin 12 is not uniformly applied under the semiconductor chip 8, so that the surface of the semiconductor chip inclines. Otherwise, as the curves and the inclinations of both the island 9 and the inner leads 3 are considered, the surface heights of the electrode pads 2 and the inner leads 3 actually vary for each semiconductor device, for each inner lead, and for each electrode pad.

Accordingly, the height difference between the electrode pad 2 and the inner lead 3 varies for each gold wire, and it is necessary to compensate in the reverse movement amount for each gold wire.

Also, the height difference between the electrode pads 2 and the inner leads 3 varies according to the inclination of the semiconductor chip 8 and the curves of the inner leads 3, however, the height difference does not vary greatly between adjacent electrode pads.

In FIG. 1, the surface heights of one electrode pad 2b and the corresponding inner lead 3b are substantially at the same height as those of the preceding electrode pad 2a and the corresponding inner lead 3a. Therefore, the reverse movement amount of the electrode pad 2b and the corresponding inner lead 3b may be determined by using the surface heights of the previous electrode pad 2a and the corresponding inner lead 3a.

That is, the semiconductor chip 8 is mounted on the island 9 on the sample stand 1 of the wire bonding apparatus. Next, the reverse movement amount is determined as mentioned in the first embodiment. The first electrode pad 2a and the first inner lead 3a are connected through the first gold wire 5, so that the first loop 11a is formed. At the same time, the surface heights of the first electrode pad 2a and the first inner lead 3a are detected, then the reverse movement amount for connecting the second electrode pad 2b and the second inner lead 3b is determined by using the surface heights of the first electrode pad 2a and the first inner lead 3a.

Next, the second electrode pad 2b and the second inner lead 3b are connected through the second gold wire 5b by using the reverse movement amount determined at the time of the first connecting step between the first electrode pad 2a and the first inner lead 3a.

In this way, the reverse movement amount is determined at each connecting step, so that the proper loop shapes are always obtained.

Although the compensatory function is directly used in this embodiment, a constant may be added to the compensatory function in order to precisely compensate the reverse movement amount.

Although the ultrasonic heat pressure welding is used in the first and second embodiments, the heat pressure welding or the ultrasonic bonding may be used instead. In the case of ultrasonic bonding, aluminum wire may be used instead of the gold wire.

What is claimed is:

1. A wire bonding method for connecting an electrode pad on a semiconductor chip and an inner lead of a lead frame through metal wire, by moving a bonding tool holding the metal wire and providing a loop in the metal wire, comprising the steps of:

calculating a height difference between the electrode pad and the inner lead, determining a reverse movement amount of the bonding tool according to said height difference, bonding the metal wire held by the bonding tool to the electrode pad, raising vertically the bonding tool to a predetermined level at which the bonding tool is reversed, reversing horizontally the bonding tool in a direction opposite to the inner lead, to provide a horizontal section of wire, at the predetermined level by the reverse movement amount determined by the determining step, wherein the horizontal section is below a top of the loop to be provided, raising vertically the bonding tool further to a top level, moving the bonding tool from the top level to the inner lead, and bonding the metal wire to the inner lead.

2. The method as claimed in claim 1, wherein
the step of calculating the height difference comprises lowering the bonding tool, holding the metal wire until the metal wire comes in contact with the electrode pad and the inner lead respectively, and detecting the contact points between the metal wire and the electrode pad and between the metal wire and the inner lead.

3. The method as claimed in claim 1, wherein the steps of calculating the height difference and determining the reverse movement amount are performed in sequence for each electrode pad and inner lead.

4. The method as claimed in claim 3, wherein
the steps of calculating the height difference and determining the reverse movement amount are performed by using data based on the preceding electrode pad and inner lead.

5. The method as claimed in claim 1, wherein
the step of determining the reverse movement amount is performed by using an interpolation law.

6. A method as claimed in claim 1, wherein the determining step uses only the height difference.

7. The method as claimed in claim 1, wherein the reversing step creates a horizontal section in the loop and a vertical section in the wire below the loop.

8. The method as claimed in claim 1, wherein the bonding to the electrode pad comprises:

lowering the bonding tool toward the chip until a predetermined search height is reached;

further lowering the bonding tool at a decelerated speed;

detecting an impact of the wire against an electrode pad on the chip; and forming a bond between the wire and the electrode pad.

9. The method as claimed in claim 8, wherein the forming step is performed by at least one of ultrasonic oscillation and application of heat.

* * * * *